US007380092B2

(12) United States Patent
Perego et al.

(10) Patent No.: US 7,380,092 B2
(45) Date of Patent: May 27, 2008

(54) MEMORY DEVICE AND SYSTEM HAVING A VARIABLE DEPTH WRITE BUFFER AND PRELOAD METHOD

(75) Inventors: Richard E. Perego, San Jose, CA (US); Frederick A. Ware, Los Altos Hills, CA (US)

(73) Assignee: Rambus Inc., Los Altos, CA (US)

( * ) Notice: Subject to any disclaimer, the term of this patent is extended or adjusted under 35 U.S.C. 154(b) by 169 days.

(21) Appl. No.: 10/442,352

(22) Filed: May 21, 2003

(65) Prior Publication Data

US 2004/0066673 A1 Apr. 8, 2004

Related U.S. Application Data

(60) Provisional application No. 60/392,198, filed on Jun. 28, 2002, provisional application No. 60/392,197, filed on Jun. 28, 2002.

(51) Int. Cl.
 *G06F 13/00* (2006.01)
(52) U.S. Cl. ..................... 711/171; 711/165
(58) Field of Classification Search ................ 711/118, 711/170, 173, 165
See application file for complete search history.

(56) References Cited

U.S. PATENT DOCUMENTS

| | | | | |
|---|---|---|---|---|
| 4,184,051 | A | * | 1/1980 | Clingenpeel ................. 370/435 |
| 5,185,863 | A | * | 2/1993 | Hamstra et al. ............... 710/61 |
| 5,245,572 | A | | 9/1993 | Kosonocky et al. |
| 5,361,343 | A | | 11/1994 | Kosonocky et al. |
| 5,367,494 | A | * | 11/1994 | Shebanow et al. ..... 365/230.03 |
| 5,631,343 | A | * | 5/1997 | Binns et al. ................. 528/274 |
| 5,748,539 | A | | 5/1998 | Sproull et al. |
| 5,778,419 | A | | 7/1998 | Hansen et al. |
| 5,893,927 | A | | 4/1999 | Hovis |
| 5,893,929 | A | | 4/1999 | Shadan et al. |
| 6,018,478 | A | * | 1/2000 | Higuchi ................. 365/189.14 |
| 6,044,429 | A | | 3/2000 | Ryan et al. |
| 6,091,660 | A | | 7/2000 | Sasaki et al. |
| 6,128,728 | A | * | 10/2000 | Dowling ..................... 712/228 |
| 6,178,132 | B1 | | 1/2001 | Chen et al. |
| 6,243,799 | B1 | * | 6/2001 | Chan et al. ................. 711/212 |

(Continued)

FOREIGN PATENT DOCUMENTS

EP          0 430 051 A2  *  11/1990

(Continued)

*Primary Examiner*—Reba I. Elmore
(74) *Attorney, Agent, or Firm*—Vierra Magen Marcus & DeNiro LLP

(57) ABSTRACT

A variable depth write data buffer is provided in a memory device coupled to a master device by an interconnect structure in an embodiment of the present invention. The variable depth write data buffer reduces a delay, or W-R turnaround bubble, time between a read operation and a write operation of a memory device memory core. The variable depth write buffer is programmable to store 1 to 4 data packets in an embodiment of the present invention. The variable depth write data buffer may also be programmed for multiple memory device configurations. A method preloads write data without address information into a write data buffer and a subsequent WRITE command causes the previously loaded write data to be retrieved from the write data buffer and written to a memory core according to an embodiment of the present invention.

32 Claims, 10 Drawing Sheets

U.S. PATENT DOCUMENTS

| | | |
|---|---|---|
| 6,314,046 B1 | 11/2001 | Kamiya et al. |
| 6,343,352 B1 * | 1/2002 | Davis et al. ................ 711/158 |
| 6,401,167 B1 | 6/2002 | Ware et al. |
| 6,636,935 B1 * | 10/2003 | Ware et al. .................... 711/5 |
| 6,640,292 B1 | 10/2003 | Barth et al. |
| 6,789,175 B2 | 9/2004 | Ryan et al. |
| 6,807,590 B1 * | 10/2004 | Carlson et al. ............... 710/57 |
| 7,058,863 B2 * | 6/2006 | Kouchi et al. .............. 714/718 |
| 2002/0018394 A1 | 2/2002 | Takahashi |
| 2002/0087750 A1 * | 7/2002 | Yi .............................. 710/33 |
| 2006/0203532 A1 * | 9/2006 | Perego et al. ................. 365/63 |

FOREIGN PATENT DOCUMENTS

| | | |
|---|---|---|
| EP | 0 833 343 A2 | 4/1998 |
| EP | 0833342 | 4/1998 |

\* cited by examiner

MEMORY DEVICE AND SYSTEM HAVING A VARIABLE DEPTH WRITE BUFFER AND PRELOAD METHOD

PRIORITY DATA

The present application claims priority to U.S. Provisional Patent Application Ser. No. 60/392,198, filed on Jun. 28, 2002, entitled, "A MEMORY DEVICE AND SYSTEM HAVING A VARIABLE DEPTH WRITE BUFFER AND PRELOAD METHOD"; and U.S. Provisional Patent Application Ser. No. 60/392,197, filed Jun. 28, 2002 entitled, "AN EARLY READ AFTER WRITE OPERATION MEMORY DEVICE, SYSTEM AND METHOD".

RELATED APPLICATION

The present application is related to U.S. Utility patent application Ser. No. 10/353,405, filed Jan. 29, 2003, entitled "AN EARLY READ AFTER WRITE OPERATION MEMORY DEVICE, SYSTEM AND METHOD", by inventors Richard E. Perego and Frederick A. Ware, which application is incorporated by reference herein.

FIELD OF THE INVENTION

The present invention relates to the transfer of data in a digital system, and in particular, a memory device and method for read and write operations.

BACKGROUND OF THE RELATED ART

Typically, an amount of idle time, known as a "bubble", occurs on the data interface of a memory device when switching from a write transfer to a read transfer, also known as "W-R turnaround bubble" time. This idle time generally occurs from resource conflicts within the memory device and/or device operating constraints.

Memory device resource conflicts may consist of: 1) shared I/O pins or circuitry between read and write operations, for example bidirectional pins, 2) shared data paths between read and write operations, for example input/output paths, shifters, column I/O amplifiers and bit lines, and 3) shared address/control paths between read and write operations, for example a column decoder or predecoder logic. Many memory devices share resources in order to reduce incremental manufacturing costs and complexity.

Device operating constraints may include peak current or power restrictions related to customer usage requirements or memory device reliability requirements.

Memory devices have reduced W-R turnaround bubble time by providing a write buffer for buffering write data and address information. However, a single write buffer may cause a delay in a write operation allowing a read operation to occur before the desired write operation. Thus, a user may receive erroneous data that does not include the latest write data. Complex circuitry may be required in order to ensure data coherency when using a single write buffer. Also, a single write buffer may not be programmed to improve data transfer efficiency in multiple memory device configurations.

What is therefore desirable is a memory device and/or method that provides improved interconnect utilization within operating constraints at a low incremental device cost and complexity. In particular, it is desirable that the memory device reduce W-R turnaround bubble time without additional complex circuitry. The memory device should also be easily adaptable to multiple memory device system configurations. Further, it is desirable for a read and write method that allows for a 1) reduced write address buffer, 2) higher memory array utilization and, 3) reduced or simplified scheduling or data coherency logic.

SUMMARY

The present invention relates to a memory device having a variable depth write buffer and/or preload method that provides improved interconnect utilization between a master device and a memory device. In particular, the variable depth write buffer can be programmed to buffer multiple data packets at a predetermined depth in an embodiment of the present invention. Further, the variable depth write buffer may be programmed to accept a data packet of varying width in multiple memory device configurations according to an embodiment of the present invention. A preload method preloads write data without address information into a write data buffer and a subsequent WRITE command causes the previously loaded write data to be retrieved from the write data buffer and written to a memory core according to an embodiment of the present invention.

In an embodiment of the present invention, a memory device has a variable depth write data buffer. The memory device is capable of being coupled to an interconnect structure for providing control information and data information. The memory device has a write control buffer for storing the control information and the variable depth write data buffer for storing the data information. A memory core is coupled to the variable depth write data buffer and stores the data information.

In another embodiment of the present invention, the variable depth write data buffer is programmable to store from one to four data packets of the data information.

In another embodiment of the present invention, a variable depth write data buffer size, in number of packets, is approximately equal to a first interval from the time a last symbol of a write data packet is present on the interconnect structure to the first possible time a first symbol of a read data packet is present on the interconnect structure divided by a second interval to transfer a read on the interconnect structure.

In an embodiment of the present invention, the packet includes 32-bits and the last and first symbol is a bit of information.

In an embodiment of the present invention, a depth of a variable depth write data buffer is varied as an inverse function of a width of a variable depth write data buffer.

In an embodiment of the present invention, the variable depth write data buffer is a first-in-first-out buffer or a randomly addressable queue.

In an embodiment of the present invention, the variable depth write data buffer depth is programmed by a software programmable register, a fuse, an anti-fuse, a pin or metal mask.

In an embodiment of the present invention, a first data packet in the data information is transported into the variable depth write data buffer during a first data phase and the first data packet is retired to the memory core during a second data phase responsive to storing the control information in the write control buffer during the second data phase.

In an embodiment of the present invention, the control information is a WRITE command.

In an embodiment of the present invention, the control information is the WRITE command following a READ command.

In an embodiment of the present invention, a second data packet is transported into the variable depth write data buffer during the second data phase.

In an embodiment of the present invention, a memory system comprises a master device coupled to a slave memory device by a interconnect structure. The master device is configured to generate a memory WRITE command with associated write information. The slave memory device is configured to process the memory WRITE command at a slave device memory core. The slave memory device includes a write control buffer for storing the memory WRITE command. A variable depth write data buffer stores the write information.

In an embodiment of the present invention, a method of operating a memory system with a master device coupled to a slave memory device is provided. A first command is generated with associated first write information during a first data phase. The first write information is buffered. The first write information is provided to a memory core of the slave memory device responsive to a second command during the third data phase.

In an embodiment of the present invention, the buffering step includes the step of transporting the first write information to a variable depth write data buffer.

In an embodiment of the present invention, the providing step is performed after a READ operation of the memory core.

In an embodiment of the present invention, address information associated with the first write information is not generated in the first data phase.

These and other embodiments of the present invention, as well as other aspects and advantages are described in more detail in conjunction with the figures, the detailed description, and the claims that follow.

BRIEF DESCRIPTION OF THE DRAWINGS

FIG. 6 is a timing diagram according to an embodiment of the present invention;

FIG. 7 is a timing diagram using a 1-deep variable depth write data buffer according to an embodiment of the present invention;

FIG. 8 is a timing diagram using a 2-deep variable depth write data buffer according to an embodiment of the present invention;

FIG. 9 is a timing diagram using a PRELOAD command and a 3-deep variable depth write data buffer according to an embodiment of the present invention;

DETAILED DESCRIPTION

I. Overview

Figure 1:
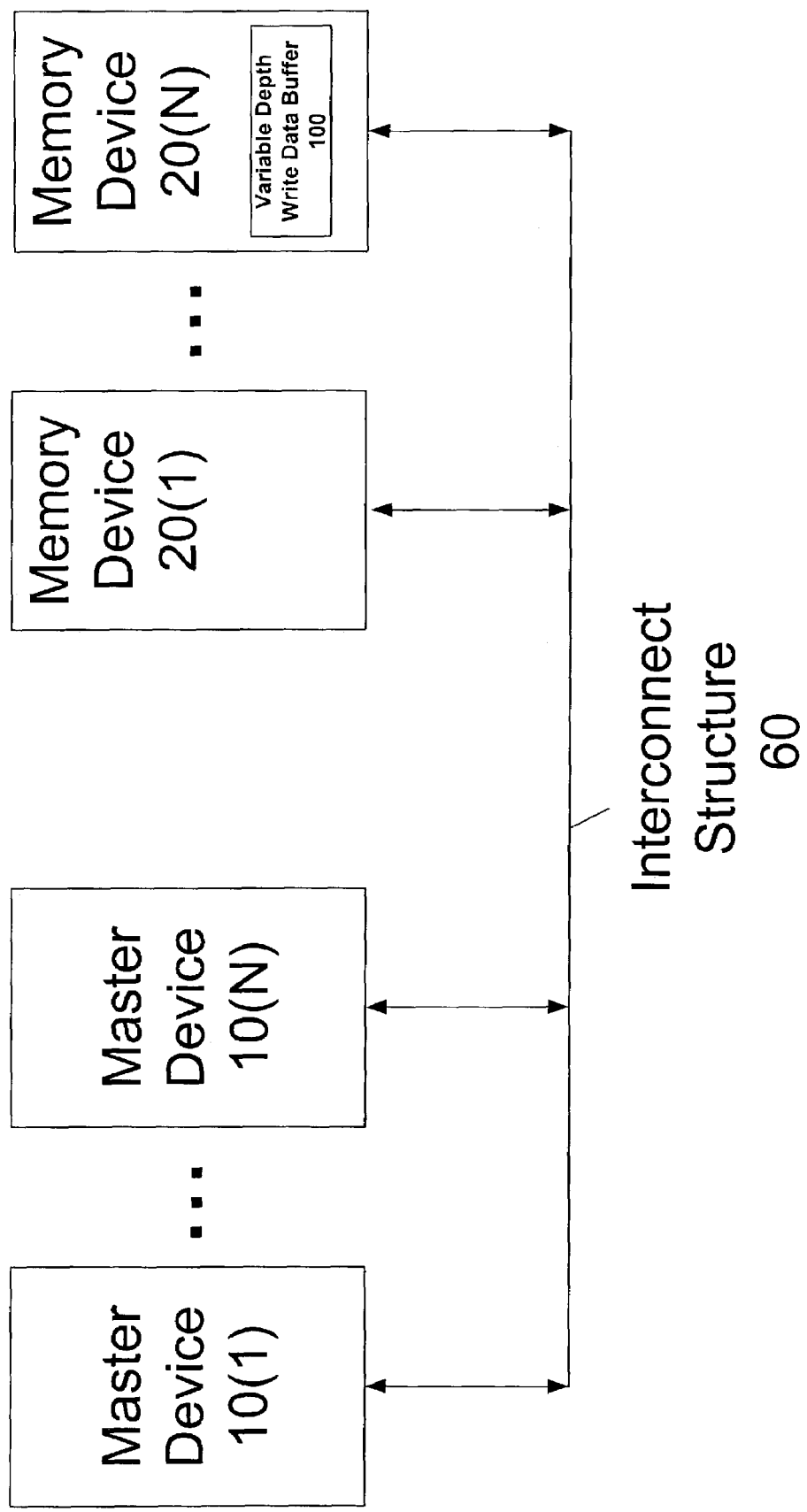
FIG. 1 is a block diagram of a digital system according to an embodiment of the present invention.

The present invention provides a variable depth write data buffer 20(N) and/or preload method, which may be implemented in a memory device, that supports improved utilization of an interconnect structure 60 between master devices 10(1)-(N) and memory devices 20(1)-(N).

A memory device, according to an embodiment of the present invention, maintains continuous data traffic by employing a variable depth write data buffer that allows the in-order completion of read and write operations. When a write operation requires a resource needed for the completion of a read operation, the data being written is stored in the variable depth write data buffer in the memory device. The write data is stored in the buffer until a resource being used by the read operation is available to communicate the data to the memory device's memory core. Once the resource, such as a shared data path or shared address/control path is available, the data is written to the memory core of the memory device.

In an embodiment of the present invention, a write operation on a memory device 20(1) is initiated by asserting a WRITE ("WR") command on interconnect structure 60 from master device 10(1) and includes a transport sub-operation and a retire sub-operation. These sub-operations may be individually specified using two other commands ("PL" and "UL"); in other words, the WR command causes both sub-operations to occur, and the PL and UL commands cause only one of the sub-operations to occur.

A transport sub-operation on memory device 20(1) can be initiated by asserting a PRELOAD ("PL") command on interconnect structure 60 from master device 10(1) and includes receiving write data from interconnect structure 60 and storing write data in a buffer in an embodiment of the present invention.

A retire sub-operation on memory device 20(1) can be initiated by asserting a UNLOAD ("UL") command on interconnect structure 60 from master device 10(1) and includes transferring write data from a buffer to a memory core in an embodiment of the present invention.

A read operation on memory device 20(1) is initiated by asserting a READ command on interconnect structure 60 from master device 10(1) and includes obtaining data from a memory core at a column address and transmitting read data on interconnect structure 60 in an embodiment of the present invention.

An activate operation on memory device 20(1) is initiated by asserting an ACTIVATE ("ACT") command on interconnect structure 60 from master device 10(1) and includes sensing a row at a row address and transferring data in a memory bank to a sense amplifier in an embodiment of the present invention.

A precharge operation on memory device 20(1) is initiated by asserting a PRECHARGE ("PRE") command on interconnect structure 60 from master device 10(1) and includes precharging a memory bank in an embodiment of the present invention.

In an embodiment of the present invention, master device 10(1) is a central processing unit in a desktop computer and memory device 20(1) is main memory, such a Dynamic Random Access Memory ("DRAM") in the desktop computer. In an alternate embodiment of the present invention, master device 10(1) is a memory controller. In alternate embodiments of the present invention, master devices 10(1)-(N), interconnect structure 60 and memory devices 20(1)-

(N) are in a processing device such as a mainframe computer, a laptop computer, a hand-held computer, a personal digital assistant, a telephone, a cellular telephone, a pager, a printer, an information appliance, or an equivalent thereof. In an embodiment of the present invention, master device 10(1)-(N), interconnect structure 60 and memory devices 20(1)-(N) are incorporated on an integrated monolithic circuit.

In an embodiment of the present invention, master devices 10(1)-(N) and memory devices 20(1)-(N) are coupled by an interconnect structure 60 which allows for one or more master devices 10(1)-(N) and one or more slave devices, such as memory devices 20(1)-(N). The term "N" is used as a general variable; its use should not imply the number of master devices is identical to the number of slave devices. In an embodiment of the present invention, other components and/or subsystems may be coupled to interconnect structure 60 that are not shown. In an embodiment of the present invention, interconnect structure 60 is an external interconnect structure from memory devices 20(1)-(N). In an embodiment of the present invention, interconnect structure 60 is a bidirectional memory bus having control and data signal lines. In an alternate embodiment of the present invention, interconnect structure 60 includes only data lines or only control lines. In still another embodiment of the present invention, interconnect structure 60 is a unidirectional bus. In an embodiment of the present invention, the block diagram of FIG. 1 is applicable to intrachip, as well as interchip, communications.

Figure 2:
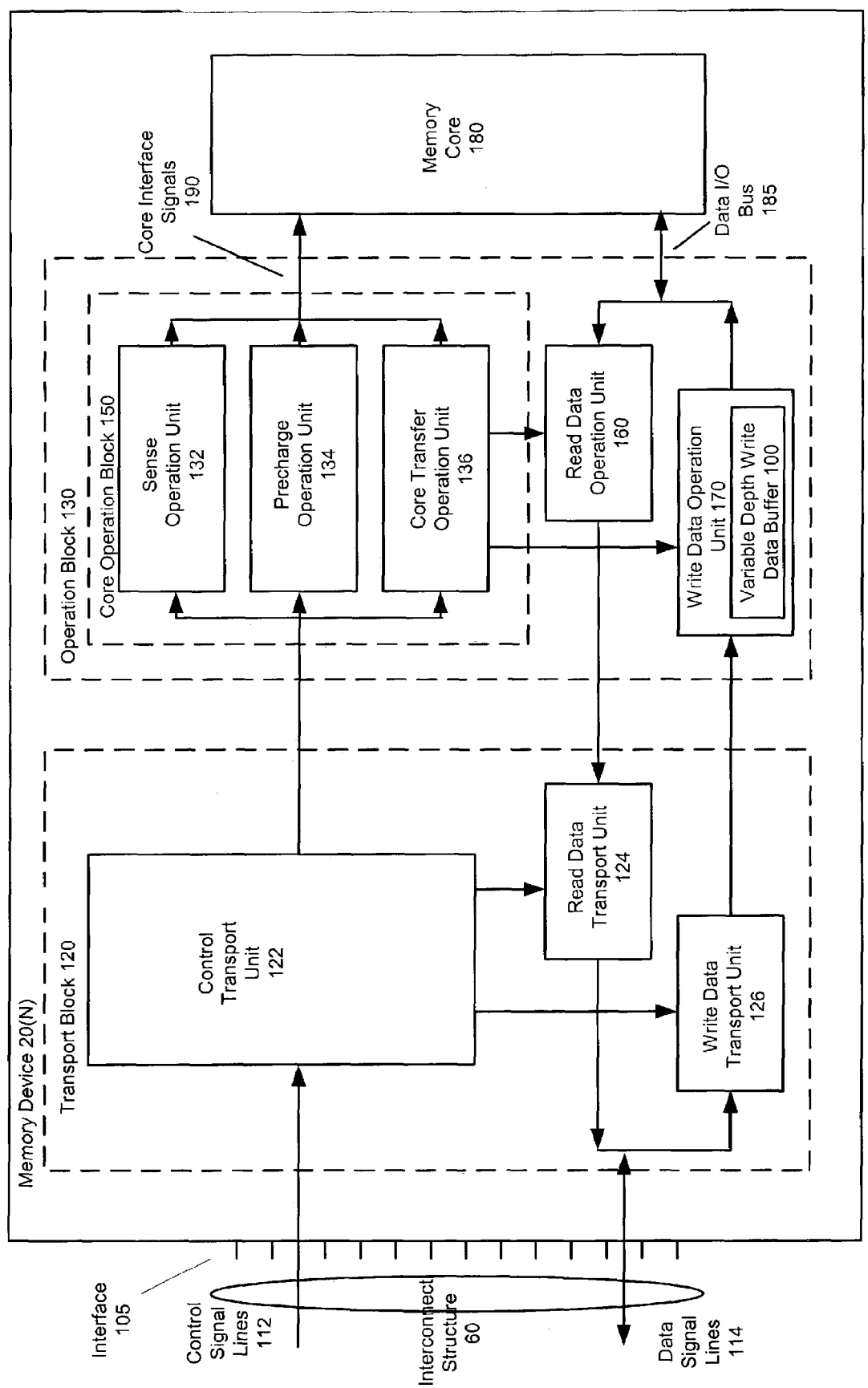
FIG. 2 is a block diagram of a memory device having a variable depth write data buffer according to an embodiment of the present invention.

FIG. 2 illustrates a memory device 20(N) as shown in FIG. 1 according to an embodiment of the present invention. Memory device 20(N) is capable of being read from and written to by a master device 10(1). An interconnect structure 60 is used to communicate control information over control lines 112 and data information over data lines 114 from the memory controller to memory device 20(N). In an embodiment of the present invention, memory device 20(N) includes an interface 105 for coupling to interconnect structure 60. In an embodiment of the present invention, interface 105 includes I/O pins. To support such communications and the storage of data, memory device 20(N) typically includes three major functional blocks.

The first of these, a transport block 120, is coupled to interconnect structure 60. Interconnect structure 60, which includes control signal lines 112 and data signal lines 114, is used to read from and write to memory device 20(N). Interconnect structure 60 provides the proper control signals and data when data is to be written to memory device 20(N). Transport block 120 receives these signals and takes the actions necessary to transfer this information to the remaining portions of memory device 20(N). When memory device 20(N) is read, transport block 120 transmits data on data signal lines 114 in response to control information on control signal lines 112. Transport block 120 includes a control transport unit 122 which receives control information on control signal lines 112, and controls a read data transport unit 124 and a write data transport unit 126 to support the communication protocol used in transferring information over interconnect structure 60 (e.g., transferring information between master device 10(1), such as a processor, and memory device 20(N) over interconnect structure 60, such as a memory bus). In an embodiment of the present invention, transport block 120 is merely wiring, without any active components whatsoever. In this embodiment, control transport unit 122 would simply be wires, as read data transport unit 124 and write data transport unit 126 would require no control. In effect, transport block 120 is not implemented in such an embodiment. Another embodiment of the present invention includes configuring amplifiers to provide the functionality of transport block 120. In yet another embodiment of the present invention, transport block 120 includes serial-to-parallel converters. In this case, control transport unit 122 controls the conversion performed by read data transport unit 124 and write data transport unit 126 (which would be the serial-to-parallel converters). Other equivalent circuits may also be used with equal success.

The second of the major functional blocks is an operations block 130. Operations block 130 receives control information from transport block 120, more specifically from control transport unit 122, which provides the requisite signals to a control operation unit 150.

Core transfer operation unit 136 controls read data operation unit 160 and write data operation unit 170 when transferring data from and to memory core 180, respectively (i.e., read and write operations). Core transfer operation unit 136 also controls memory core 180, causing memory core 180 to store write data and output read data. Precharge operation unit 134 controls memory core precharge operations, which precharge the selected banks in memory core 180. Sense operation unit 132 is provided for the control of memory core sense operations.

The subsystems of operations block 130 uses the control information received to coordinate movement of control and data information to and from memory core 180. Read data operation unit 160 and a write data operation unit 170 contain circuitry specific to the functions that read and write data from and to memory core 180, respectively. Core transfer operation unit 136 contains circuitry used to control memory core 180, including circuitry for the control of read and write operations. Core interface signals 190 are provided to control memory core 180.

In FIG. 2, control operation unit 150 controls a typical array of DRAM memory cells. In an alternate embodiment of the present invention, control operation unit 150 generates core interface signals for a particular DRAM memory cell architecture. Control operation unit 150 includes a sense operation unit 132, a precharge operation unit 134, and a core transfer operation unit 136 in an embodiment of the present invention.

Data being read is transferred from the third functional block, a memory core 180, via data I/O bus 185 to a read data operation unit 160. From read data operation unit 160, the data being read is transferred to read data transport unit 124 (and subsequently, onto data signal lines 114) in response to control signals from control operation unit 150. Read data operation unit 160 may consist of, for example, data buffers (not shown) that buffer the outgoing data signals to drive read data transport unit 124.

Data is transferred from write data transport unit 126 to a write operation unit 170 in response to control signals from control transport unit 122 (if used) and control operation unit 150. Write data operation unit 170 receives write data from write transport unit 126, which is passed on to memory core 180 via data I/O bus 185. As shown, write data core transfer operation unit 136 may control write operation unit 170. In an embodiment of the present invention, write data operation unit 170 includes a variable depth data write buffer 100 that buffers the incoming data signals.

Write data operation unit 170 may also contain mask buffers that buffer mask information received from write data transport unit 126. As with data buffering, these actions may be taken under the control of core transfer operation unit 136. The mask information is then passed to memory core 180 via data I/O bus 185, as well. The mask information is used to selectively write parts of the data within the memory core. In an alternate embodiment of the present invention, no mask is employed, with the result that all the data is written unconditionally.

In an alternate embodiment of the present invention, memory device 20(N) includes a shifter and/or predecoder circuitry.

The circuitry of control operation block 150 may take any number of appropriate configurations, depending in part on the architecture of memory core 180. In embodiments of the present invention, the memory cells of memory core 180 may be static random access memory ("SRAM") cells, read-only memory ("ROM") cells, DRAM cells, or other types of memory cells. The type of memory cells employed in memory core 180 affects the architecture of control operation unit 150, as different memory cells often require different control signals for their operation. Operational block 130 thus contains core transfer operation block, read data operation unit 160, and write data operation unit 170.

In a memory core 180 having a DRAM-type memory cells embodiment, operations which may be performed on memory core 180 (referred to herein as core operations) may be generalized into four primary categories: 1) precharge; 2) activate; 3) read; and 4) write.

Figure 3:
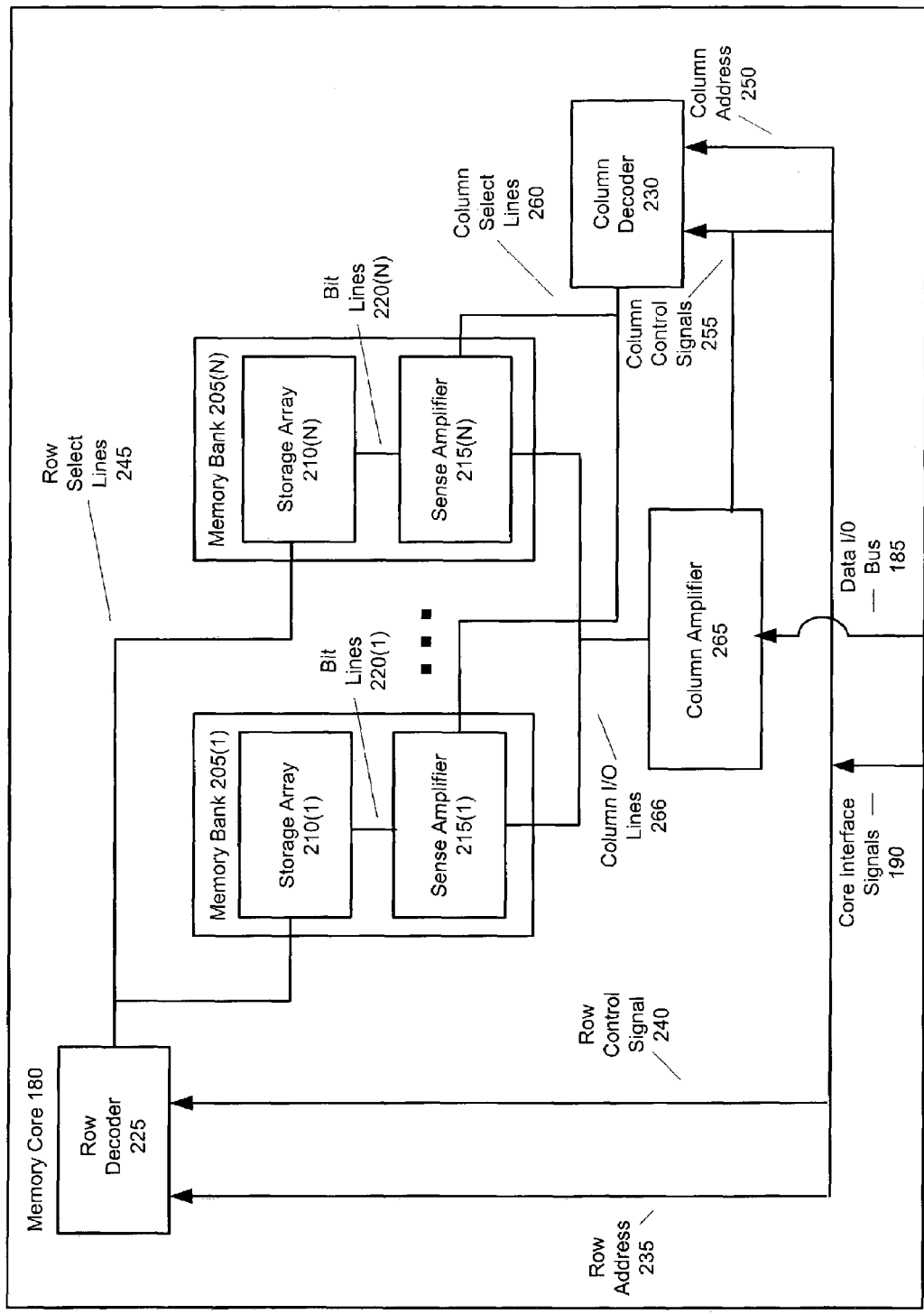
FIG. 3 is a block diagram of a memory core according to an embodiment of the present invention.

FIG. 3 illustrates a memory core 180 shown in FIG. 2 in an embodiment of the present invention. Memory core 180 includes several basic functional blocks. Memory core 180 is illustrated as including multiple memory banks 205(1)-(N). In an alternate embodiment of the present invention, memory core 180 can be implemented using only a single memory bank (e.g., memory bank 205(1)). Included in each of memory banks 205(1)-(N) are a storage array, exemplified by storage arrays 210(1)-(N), and a set of sense amplifiers, exemplified by sense amplifiers 215(1)-(N). Storage arrays 210(1)-(N) are central to the function of memory core 180, actually holding the data to be stored. Storage arrays 210(1)-(N) are connected to sense amplifiers 215(1)-(N) by bit lines 220(1)-(N), respectively. Storage arrays 210(1)-(N) are organized into rows and columns of storage cells, each of which stores one bit of information in an embodiment of the present invention. In an alternate embodiment, a storage cell in storage arrays 210(1)-(N) stores multiple bits of information.

Also included in memory core 180 are a row decoder 225 and a column decoder 230. A row address 235 is provided to row decoder 225, along with row control signals 240, which cause row decoder 225 to latch a row address. In turn, row decoder 225 presents this address information to memory banks 205(1)-(N) via row select lines 245. Similarly, a column address 250 is provided to column decoder 230, along with column control signals 255, which causes column decoder 230 to latch a column address. In turn, column decoder 230 presents this address information to memory banks 205(1)-(N) via column select lines 260 to select which sense amplifiers are connected to the column amplifier 265. The column control signals 255 may include a mask bit signal to selectively mask individual sense amplifiers in accordance with a predetermined masking scheme.

Column control signals 255 are also provided to column amplifier 265. Column amplifier 265 are coupled to sense amplifiers 215(1)-(N) by column I/O lines 266, and amplify the data signals input to and output from sense amplifiers 215(1)-(N). Column amplifier 265 is also coupled to data I/O bus 185, permitting the communication of control signals from operations block 130 to the various control structures within memory core 180. The signals aggregated as core interface signals 190, as illustrated in FIG. 2, thus include row address 235, row control signals 240, column address 250, and column control signals 255. Thus, the interface to a memory core 180 generally consists of a row address, a column address, a datapath, and various control signals, including mask signals.

As shown in FIG. 3, memory cores can have multiple banks, which allows simultaneous row operations within a given core in an embodiment of the present invention. The use of multiple banks improves memory performance through increased concurrency and a reduction of conflicts. Each bank has its own storage array and can have its own set of sense amplifiers to allow for independent row operation. In an embodiment of the present invention, a column decoder and datapath are shared between banks in order to reduce cost and area requirements.

Accessing the information in a storage array (i.e., reading data stored in storage arrays 210(1)-(N)) is typically a two step process. First, data is transferred between storage array 210(1)-(N) and a corresponding set of sense amplifiers 215(1)-(N). Next, the data is transferred between the sense amplifiers involved and the column amplifier 265. Certain memory core architectures do away with the column amplifiers, transferring the data from the sense amplifiers directly to the data I/O bus 185.

The first major step, transferring information between storage arrays 210(1)-(N) and sense amplifiers 215(1)-(N), is known as a "row access" and is broken down into the minor operations of precharge and activate. The precharge operation prepares the sense amplifiers and bit lines for sensing, typically by equilibrating them to a midpoint reference voltage. During the activate operation, the row address is decoded, a single word line is asserted, the contents of the storage cell is placed on the bit lines, and the sense amplifiers amplify the value to full rail (i.e., a full digital high value), completing the movement of the information from the storage array to the sense amplifiers. Of note is the fact that the sense amplifiers can also serve as a local cache that stores a "page" of data that can be more quickly accessed with column read or write accesses. The second major step, transferring information between the sense amplifiers and the interface, is called a "column access" and is typically performed in one step. However, variations are possible in which this major step is broken up into two minor steps, e.g. putting a pipeline stage at the output of the column decoder. In this case the pipeline timing should be adjusted to account for the extra time involved.

These two steps give rise to the four basic memory operations mentioned previously: 1) precharge; 2) activate; 3) read; and 4) write. In an embodiment of the present invention, memory core 180 supports these four operations (or some subset thereof). In an alternate embodiment, certain memory types may require additional operations to support architecture-specific features.

A significant limitation on the effective bandwidth of interconnect structure 60 can arise as the result of the issuance of certain combinations of read and write operations. For example, the issuances of certain READ/WRITE command combinations may intrinsically introduce inefficiencies in the utilization of interconnect structure 60. For example, a delay, also known as a W-R turnaround time data bubble, may occur when a write operation is followed by a read operation. Because the write data is immediately present on interconnect structure 60 and the read data is not present until a later time (determined by the access time of the device being read), a data bubble between the write data and read data naturally occurs. This data bubble impairs the efficient utilization of interconnect structure 60 and the column I/O datapath. These delays are of particular importance in systems which are configured to maintain full or almost full utilization of interconnect structure 60 by constantly (or nearly constantly) transferring data to and from components attached thereto.

In a memory device 20(1), the resource usage ordering for read and write operations differs slightly. A read operation uses resources in the order: 1) control signal lines 112, 2) column I/O datapath (including data I/O bus 185 and column I/O lines 266), and 3) data signal lines 114; while, a write operation uses them in the order: 1) control signal lines 112, 2) data signal lines 114, and 3) column I/O datapath (including data I/O bus 185 and column I/O lines 266).

These differences in the ordering of resource usage give rise to resource conflicts when read and write operations are issued because control signals issued over control signal lines 114 cause data to be transferred immediately, in relative terms. Thus, if data signal lines 114 and the column I/O datapath are bidirectional (as is desirable), conflicts can occur between read data and write data because each transfer requires the use of these resources.

Figure 4:
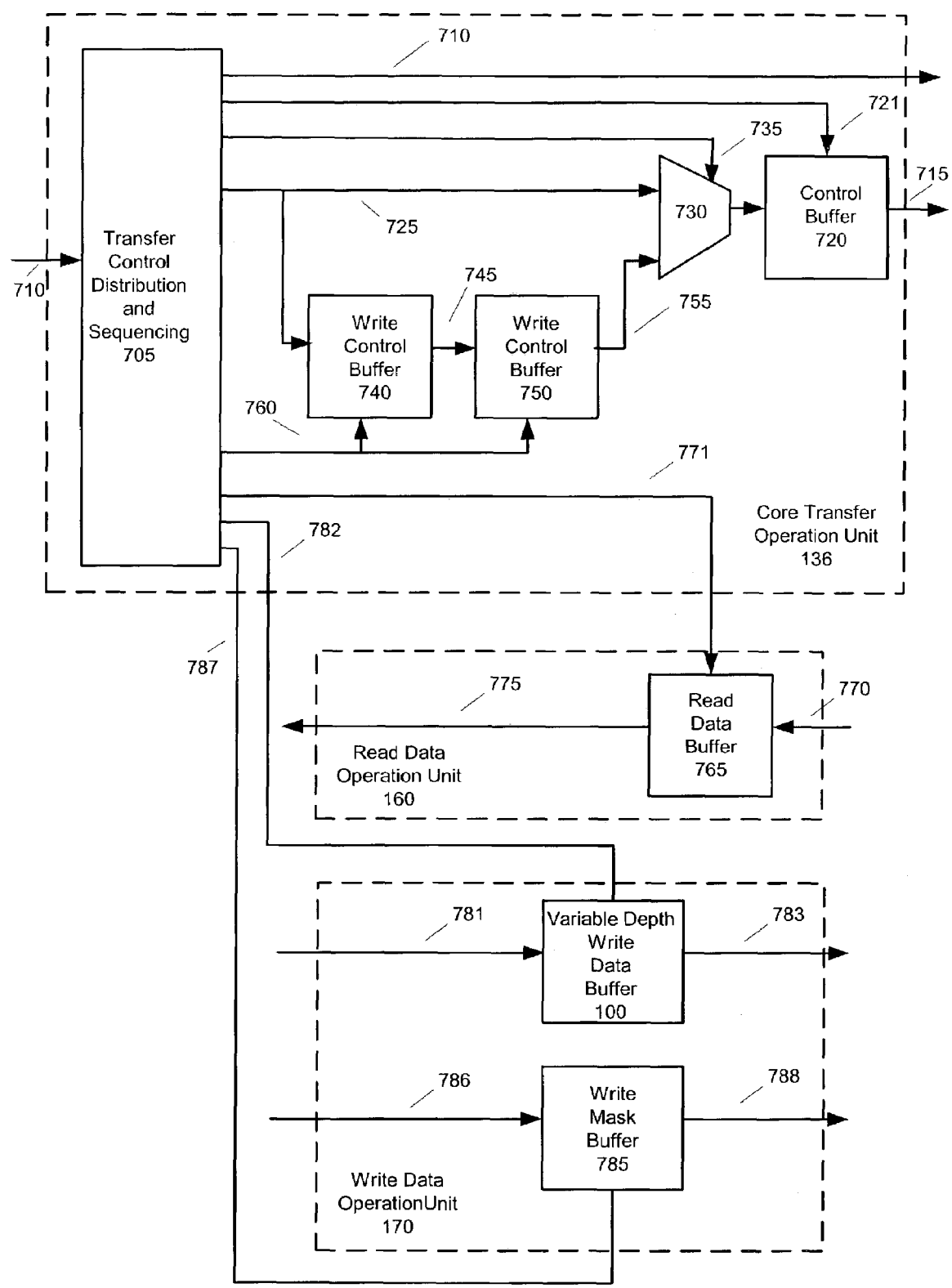
FIG. 4 is a block diagram of a memory device containing circuitry that may be utilized in accordance with an embodiment of the present invention.

FIG. 4 shows the structure of a core transfer operation unit 136, a read data operation unit 160, and a write data operation unit 170 (including a variable depth write data buffer 100) for a memory that performs operations that are signaled on the control lines according to an embodiment of the present invention. Control signals 710 are received from control transport unit 122. Transfer, control, distribution, and sequence ("TCDS") block 705 produces signals to control the memory core 180, the read data operation unit 160, and write data operation unit 170. TCDS block 705 handles transfer, control, signal distribution, and sequencing responsibilities. Signals 710 are the edge based control signals for memory core 180. Signals 715 are signals that are presented to core 180 for a duration of time, and usually have setup and hold requirements with respect to the transition times of signals 710, and are produced by control buffer 720. For a read operation, control buffer 720 receives control signals directly from TCDS block 705 via signals 725 through multiplexer 730 that is controlled by signal 735. For a write operation, control buffer 720 receives control signals from TCDS block 705 via write control buffer 740, signals 745, write control buffer 750, signals 755, and multiplexer 730 (under the control of signal 735). Write control buffers 740 and 750 are controlled by signals 760. For write control buffer write operations, signals 710 are timed to correspond to the arrival of the operation to signals 715. Write control buffers 740 and 750 delay the application of the operation control to the memory core. This delay allows the data corresponding to the buffered write operation to be issued later, better matching the timing of the write operation to that of the read operation. Other embodiments may use additional blocks to change the amount of the delay.

Read data buffer 765 receives read data on signals 770 from memory core 180, at times controlled by signal 771. This data is passed on to the transport block 120 via signals 775. In another embodiment, read data buffer 765 is an amplifier driving signals 775 without timing signal 771. In yet another embodiment, read data operation unit 160 is comprised only of a wire. Other variations for read data operation unit 160 are possible, depending on specific drive and timing characteristics of memory core 180.

Variable depth write data buffer 100 receives write data from transport block 120 via signals 781 at times controlled by signal 782. This data is passed on to the memory core 180 via signals 783. Write mask buffer 785 receives mask data from the transport unit on signals 786 at times controlled by signal 787. The mask information is passed on to memory core 180 via signals 788. Mask data is used by memory core 180 to selectively write, or not write, parts of the data within memory core 180. In another embodiment, no mask is used, with the result that all the data is written unconditionally.

II. Variable Depth Write Buffer

The depth, or numbers of packets, stored in variable depth write data buffer 100 depends on a number of factors. In an embodiment of the present invention, a data packet is transferred in 10 ns and includes 32-bits of information per signal with 32 signals provided in parallel. In order to maintain maximum data transfer efficiency, the depth is approximately equal to the round trip latency from the last symbol of write data sampled at a data pin of memory device 20(1) to the first symbol of read data driven onto a data pin of memory device 20(1) divided by the data packet time. In an embodiment of the present invention, a symbol is a bit of information. In general, data transfer efficiency improves as a function of write data buffer depth up to some limit. Table A below shows the relationship between a write data buffer depth and W-R turnaround bubble time.

TABLE A

| Write Buffer Depth | W-R Turnaround Bubble (ns) |
|---|---|
| 0 | 20 |
| 1 | 15 |
| 2 | 10 |
| 3 | 5 |
| 4 | approx. 0 |

While a write data buffer depth of 4 may provide an approximate zero W-R turnaround bubble time, the cost associated with additional write data buffer memory and complexity of related circuitry may not warrant the reduction in W-R turnaround bubble time in all applications. Therefore, a variable depth write buffer that may be programmed to meet a particular application is desirable.

Figure 5A:
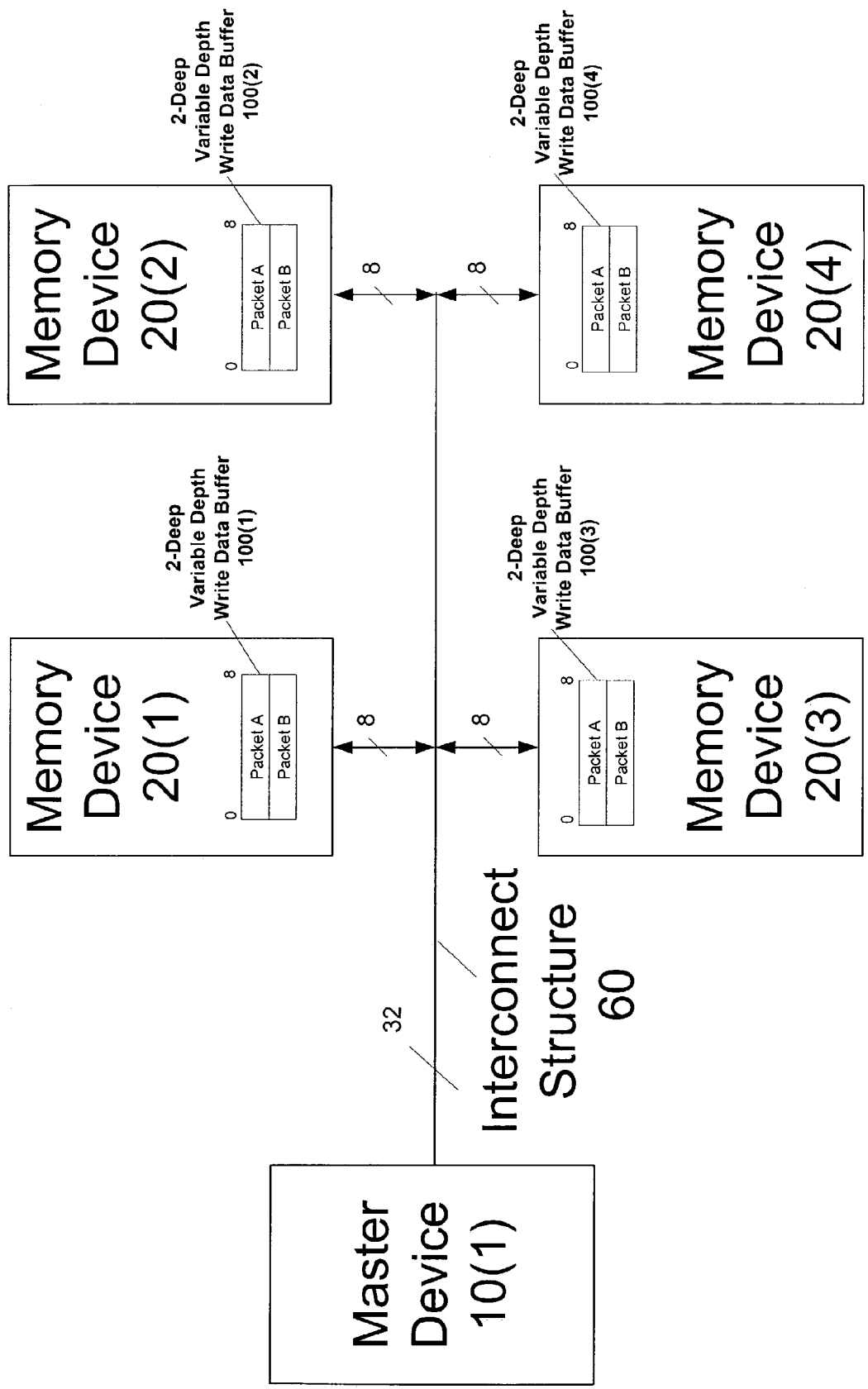
FIGS. 5a-b illustrate a variable depth write data buffer in accordance with an embodiment of the present invention.

The depth of variable depth write data buffer 100 is varied as a function of a write data buffer data entry size. In an embodiment of the present invention, FIG. 5a illustrates a memory architecture supporting multiple device widths from a common memory die. The amount of data written per core access is reduced as a memory device width is reduced; commensurately reducing the amounts of data required per write data buffer entry. This allows a write buffer depth to increase as a memory device width is reduced, potentially increasing the data transfer efficiency on interconnect structure 60 between master device 10(1) and a memory device 20(N).

Figure 5B:
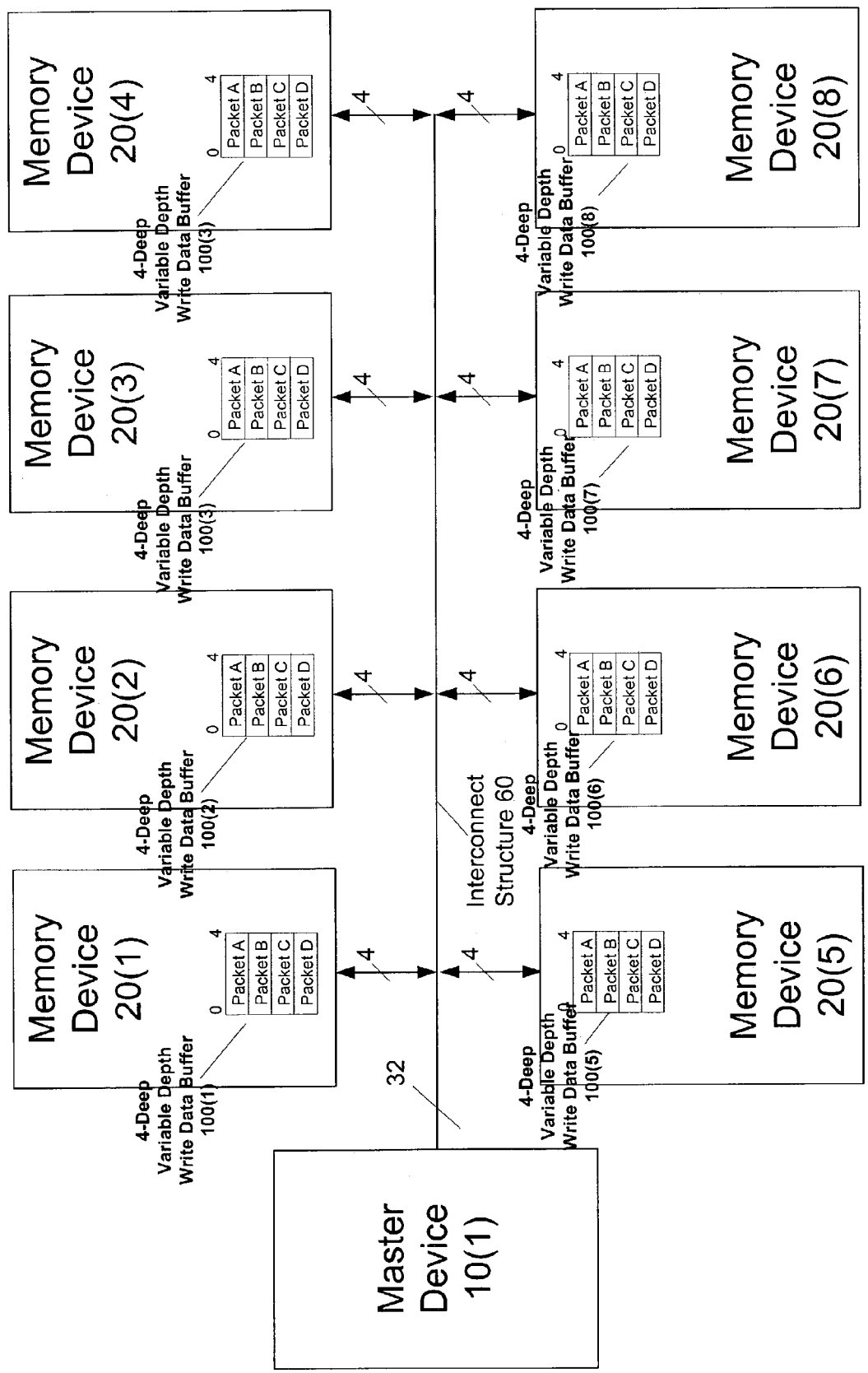

FIGS. 5a-b illustrate a variable depth write data buffer in memory devices 20(1)-(4) and 20(1)-(8), respectively, according to an embodiment of the present invention. The memory devices are couple to master device 10(1) by interconnect structure 60. In an embodiment of the present invention, interconnect structure 60 is a 32-bit wide memory bus and master device 10(1) is a memory controller.

FIG. 5a illustrates 2-deep variable depth write data buffers 100(1)-(4) in memory devices 20(1)-(4), respectively. Packet A and Packet B may be stored in the respective variable depth write buffers. In an embodiment of the present invention, variable depth write data buffers 100(1)-(4) store 2 8-bit packets. In alternate embodiments of the present invention, every memory device may not have a variable depth write data buffer.

FIG. 5b illustrates 4-deep variable depth write data buffers 100(1)-(8) in memory devices 20(1)-(8), respectively. FIG. 5b, like FIG. 5a, illustrates a master device 10(1) coupled to memory devices by an interconnect structure 60. In an embodiment of the present invention, interconnect structure 60 is a 32-bit wide memory bus and master device 10(1) is a memory controller. 4-deep variable depth write data buffers 100(1)-(8) have been programmed to store 4 4-bit packets from interconnect structure 60: packet A, packet B, packet C, and packet D. The increased depth of a variable depth write buffer enables a potential higher data transfer efficiency between master device 10(1) and memory devices 20(1)-(8). In alternate embodiments of the present invention, other depths and widths are used for a variable depth data write data buffer.

In an embodiment of the present invention, a variable depth write data buffer is programmed to a predetermined depth by software-programmable registers, fuses, anti-fuses, pins, metal-masks or an equivalent thereof.

In an embodiment of the present invention, a variable depth write data buffer is a first-in-first-out ("FIFO") buffer. In an alternate embodiment of the present invention, a variable depth write data buffer is a randomly addressable queue. In the randomly-addressable queue embodiment, a write buffer index is transferred with a PRELOAD or WRITE command.

Figures 6, 7, 8:
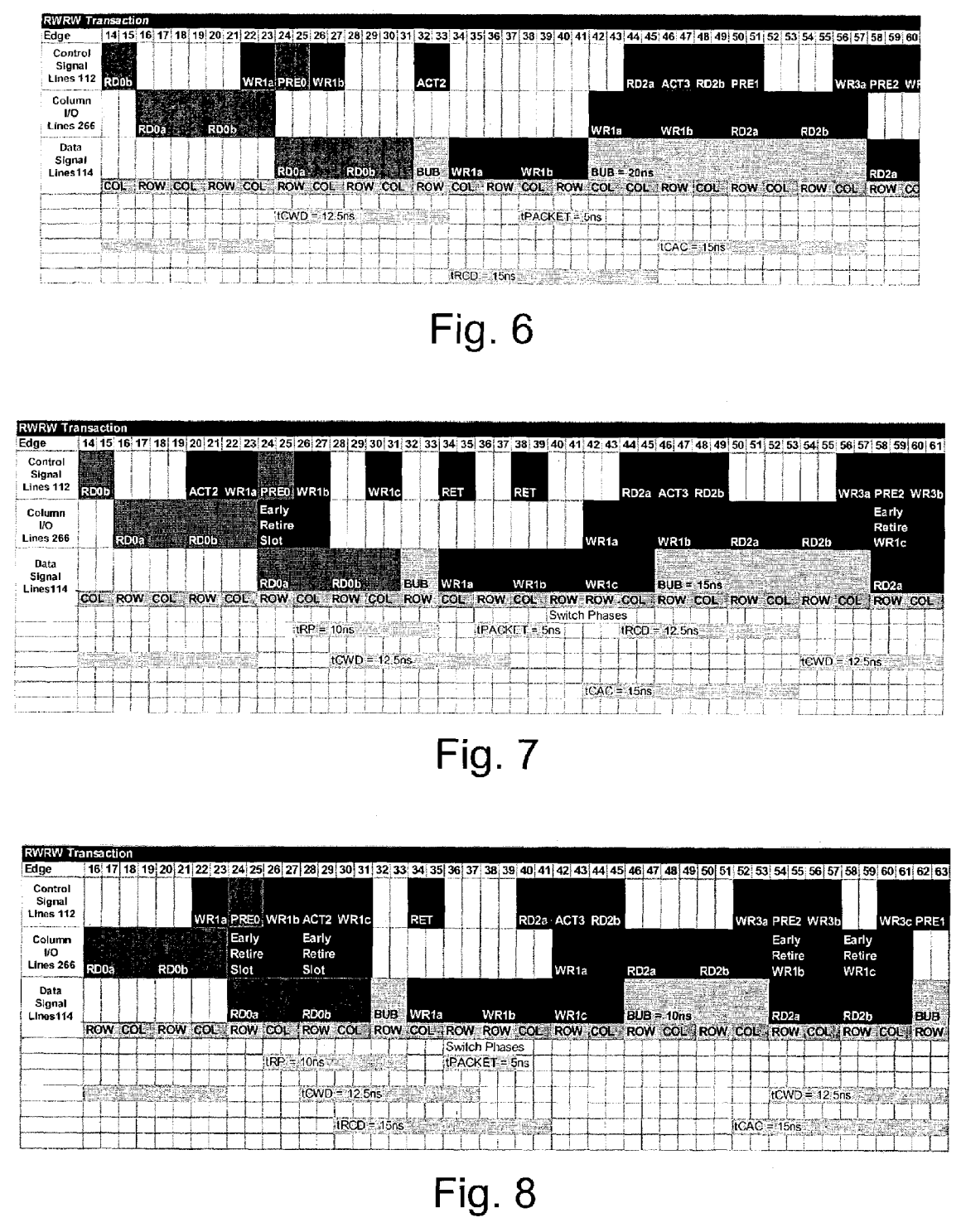

FIG. 6 is a timing diagram illustrating a W-R turnaround bubble time BUB using a memory device that does not have a variable write data buffer. In an embodiment of the present invention, every 4 horizontal cells in FIGS. 6-9 equals 5 ns.

In an embodiment of the present invention, control signals received by memory device 20(N), and in particular on control signal lines 112 illustrated in FIG. 2, are represented on the row labeled control signal lines 112. A shaded box represents the duration of a particular signal on control signal lines 112. For example, a shaded box labeled RD0b at row control signal lines 112 and columns 14-15 represents a READ command generated on control signal lines 112 for reading the contents of memory core 180. Shaded boxes are grayscale coded to correspond to associate memory bank 205 addresses.

In an embodiment of the present invention, a READ command is represented as RD0a, RD0b, . . . RD2a, RD2b, . . . ; while, a WRITE command is represented as WR1a, WR1b, WR1c, . . . WR2a, WR2b, WR2c, . . . Similarly, column I/O signals generated by memory device 20(N) on column I/O lines 266 are represented on the row labeled column I/O lines 266. In an embodiment of the present invention, bi-directional data signals generated on data lines 114 are represented on the row labeled data signal lines 114. In an embodiment of the present invention, a PRECHARGE command is represented as PRE0, PRE01, PRE2, . . . and an activation command is represented as ACT0, ACT1, ACT2, ACT3, ACT4, ACT5 . . . In an embodiment of the present invention, a RETIRE command is represented by RET and a PRELOAD command is represented by PL1a, PL1b, PL1c, PL1d . . . , PL3a, PL3b, PL3c, PL3d . . . and PL5a, PL5b, PL5c, . . . .

In an embodiment of the present invention, a PRECHARGE command prepares sense amplifier 215 and bit lines 220 for sensing, typically by equilibrating them to a midpoint reference voltage. During the activate operation, row address 235 is decoded, a single word line is asserted, the contents of the storage cell is placed on bit lines 220, and sense amplifier 215 amplifies the value to full rail (i.e. a full digital high value), completing the movement of the information from storage array 210 to sense amplifier 215. Transferring information on column I/O lines 266 from sense amplifier 215 to column amplifier 265 is known as "column access."

In an embodiment of the present invention, an ACTIVATE command allows for accessing a particular memory bank 205

In an embodiment of the present invention, a RETIRE command causes the data stored in a write buffer to be transferred from the buffer into memory core 180 by way of data I/O path 185 and column I/O lines 266.

A PRELOAD command is discussed in detail below.

tRP time is defined as the time between the end of a PRECHARGE command on control signal lines 112 and the end of the next ACTIVATE command to the same memory bank 114 in an embodiment of the present invention.

tCWD time is defined as the time between the end of a WRITE command on control signal lines 112 and the beginning of receiving write data on data signal lines 114 in an embodiment of the present invention.

tRCD time is defined as the time interval between the end of ACTIVATE command and the beginning of I/O column signals on column I/O lines 266 (read or write) in an embodiment of the present invention.

tCAC time is defined as the time interval between the end of a READ command and the beginning of generating read data on data lines 114 in an embodiment of the present invention.

In an embodiment of the present invention, a WRITE operation for a memory device 20(N) is defined as the time between the last bit obtained (for writing) from a data pin interface (for example, data signal lines 114) to the beginning of a column I/O cycle (for example, column I/O lines 266). In an embodiment of the present invention, a WRITE operation occurs in 5 ns using an 800 MHz clock signal. In an embodiment of the present invention, a READ operation for memory device 20(N) is defined as the time from when a memory cell in memory core 180 is latched to the first bit obtained (for reading) from a data pin (for example, data signal lines 114).

FIG. 7 is a timing diagram illustrating a W-R turnaround bubble time BUB using a memory device that has a 1-deep variable write data buffer. The W-R turnaround bubble time BUB has been reduced to approximately 15 ns from 20 ns.

FIG. 8 is a timing diagram illustrating a W-R turnaround bubble time BUB using a memory device that has a 2-deep variable write data buffer. The W-R turnaround bubble time BUB has been further reduced to approximately 10 ns from 20 ns—a 100% delay reduction.

Similar timing relationships between control signals, column I/O signals and data signals are used to obtain a W-R turnaround bubble time BUB of approximately 5 ns and approximately 0 for a 3-deep and 4-deep variable write data buffer, respectively.

As can be appreciated by one of ordinary skill in the art, there are several advantages to a variable depth write data buffer. In particular, a lower cost baseline memory device can be produced, which can then scale to maximum data transfer efficiency with the addition of more memory devices.

III. Preload Method

A preload method using a PRELOAD command also improves data transfer efficiency in an embodiment of the present invention. A preload method includes both a preload operation and a write operation in an embodiment of the present invention. In an alternate embodiment, variable depth write data buffer 100 is used with a preload method. In an embodiment of the present invention, a PRELOAD command generated on control signal lines 112, illustrated in FIG. 2, allows for write data generated on data signal lines 114 to be stored in a write buffer, such as variable depth write buffer 100, in advance of a command containing an address (for the write data) which ultimately writes the contents of the write buffer to memory core 180.

In prior memory device operations, a WRITE command also contains the address for the write operation. The data phase associated (in time) with the WRITE command contains the data to be written for the write operation. The data and address information is stored in a write buffer until a retire suboperation. A retire suboperation can be in the form of 1) an explicit RETIRE command or 2) an implicit retire triggered by a WRITE command. FIGS. 6-8 illustrate the prior write or retire suboperations.

Figure 9:
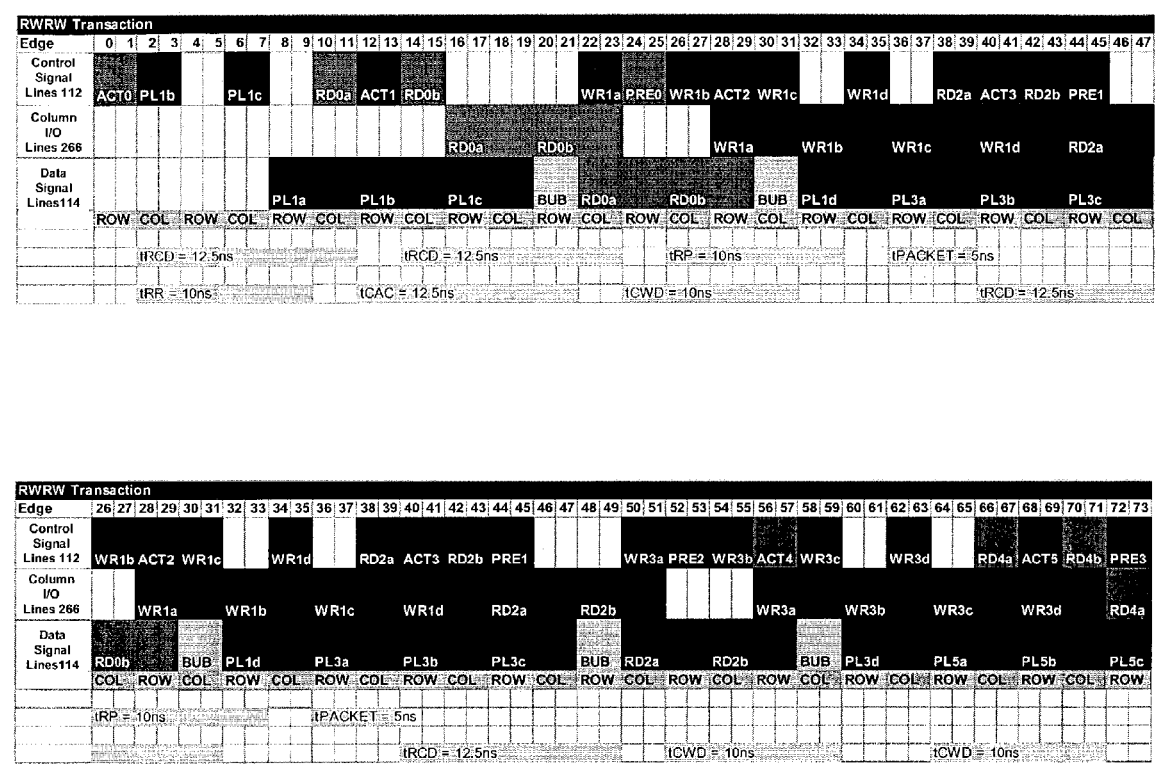

A timing diagram (partially overlapping) illustrated in FIG. 9 shows a preload method according to an embodiment of the present invention. In particular, FIG. 9 shows the use of PRELOAD commands with a 3-deep variable depth write data buffer. Three PRELOAD commands are issued (PL1a, PL1b, PL1c) on control signal lines 112, each having a corresponding data phase, the data for each command being written to an entry of the 3-deep write data buffer. Address information is not transferred for these preload operations. After the preload operations have finished, two read operations (RD0a and RD0b) are completed. Then a R-W transition occurs, after which a first WRITE command is issued (WR1a). A WR1a command causes the previously preloaded data (PL1a) to be retrieved from variable depth write data buffer 100 and written to the memory core 180. As can be seen from FIG. 9, the delay from a command on control signal lines 112 to the associated signals on column I/O lines 266 is approximately equal for both read and write operations. This helps to more fully utilize column amplifier 265 relative to previous write methods.

A data phase associated in time with a WR1a command contains preload data for a future write (PL1d). In effect, write data is preloaded early, ahead of a WRITE command that references that data, using the time slots associated with preceding write commands.

Another significant aspect of a preload method is that information on control signal lines 112 and column I/O lines 266 maintain the same ordering for read and write operations. Unlike prior write methods, there is effectively no reordering of data relative to the commands at the memory array interface (column I/O lines 266), although write data occupies earlier time slots on data signal lines 114. Thus, the preload method does not require complex circuitry, such as a blender circuit, or complex scheduling to ensure data coherency.

Figure 10:
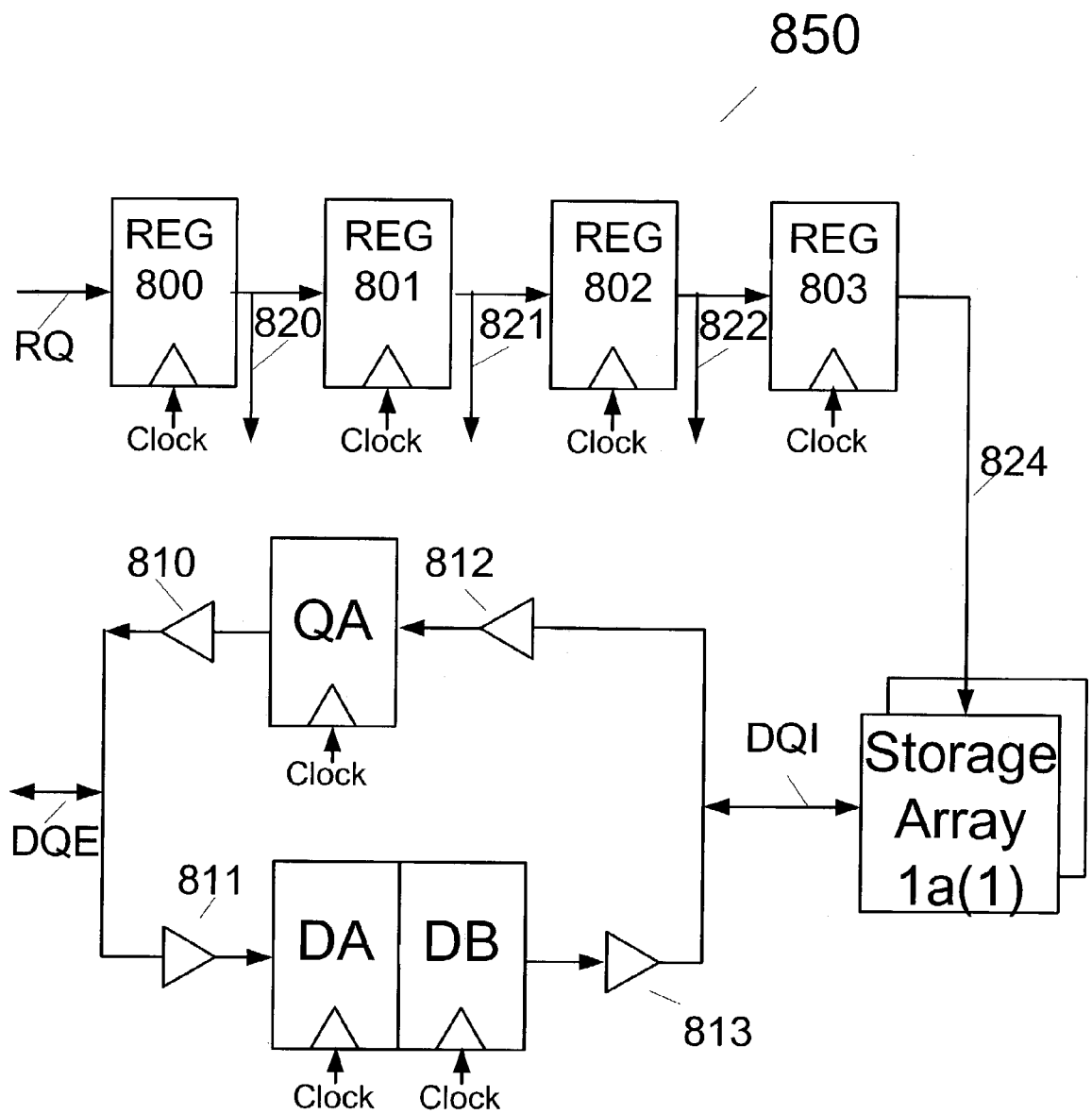
FIG. 10 illustrates a block diagram of a memory device according to an embodiment of the present invention.
Figure 11A:
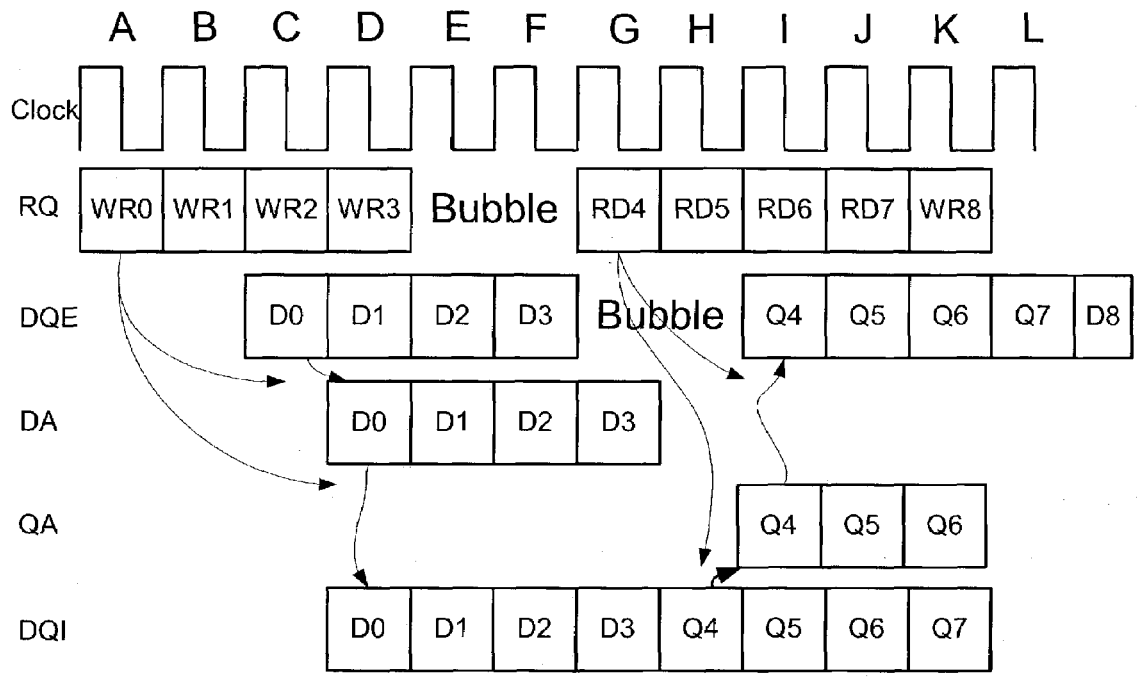
FIG. 11a is a timing diagram of a memory device that does not have a write buffer; and, FIG. 11b is a timing diagram of the memory device shown in FIG. 10.
Figure 11B:
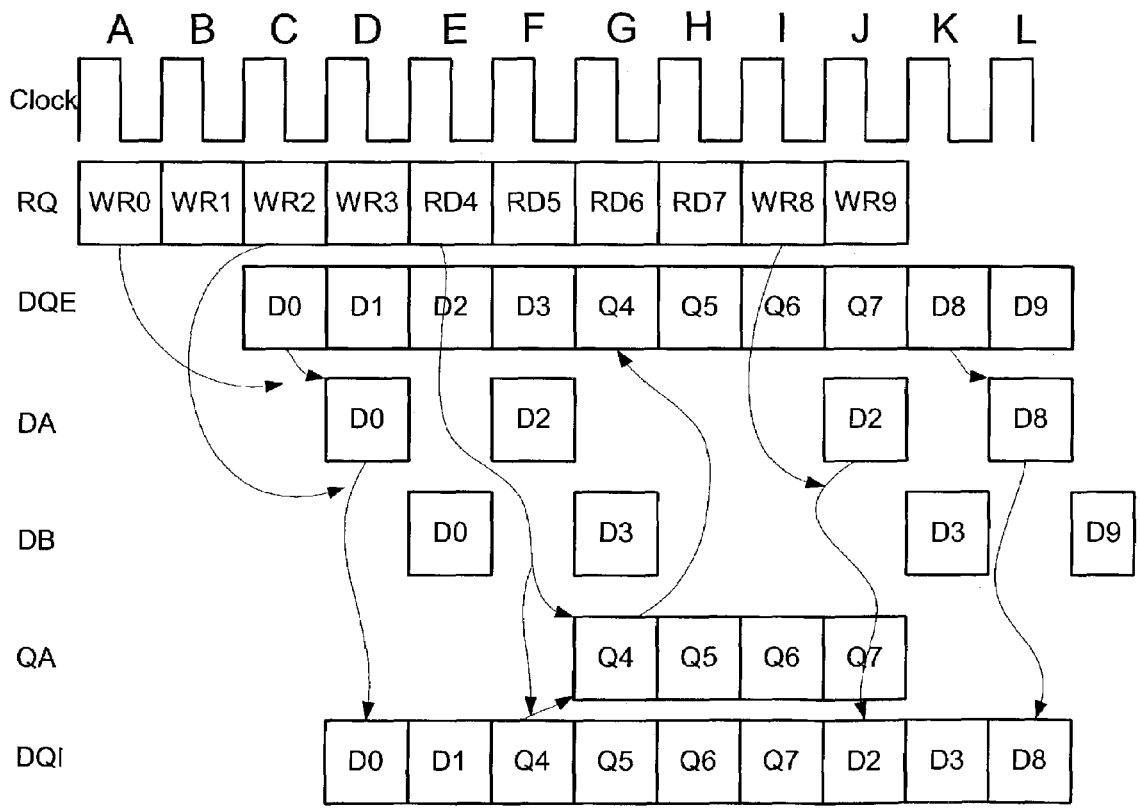

FIGS. 10 and 11 illustrate another embodiment of the present invention. FIG. 10 illustrates a block diagram of a memory device 850 in an embodiment of the present invention and FIG. 11b illustrates a timing diagram of memory device 850 shown in FIG. 10. In an embodiment of the present invention, memory device 850 corresponds to memory device 20(N) and, RQ and DQE interfaces connect to interconnect structure 60 shown in FIG. 1.

Memory device 850 is coupled to an interface RQ that is sampled and held by a register 800. In an embodiment of the present invention, interface RQ transfers a command to register 800. In alternate embodiments, multiple registers 800-803 are used to delay asserting a command on lines 820, 821, 822 and 824. These delayed commands are decoded to provide control signals that enable read and write data to move between the DQE interface and the storage arrays. Interface DQE is sampled during a write operation by registers DA/DB and interface DQE is driven during a read operation by the output of register QA. In an embodiment of the present invention, buffers 810-813 are used at the outputs and inputs of registers QA and DA/DB, and are conditionally enabled to transfer read or write data from one point to another. Registers QA and DA/DB, like registers 800-803, are controlled by a clock signal. In an embodiment of the present invention, register DA/DB drives write data through an internal interconnect structure DQI to a set of storage arrays 1a(1) through 1a(N), or the set of storage arrays 1a(1) through storage arrays 1a(N) drive read data through an internal interconnect structure DQI to register QA. In a clock cycle, interface DQE may either hold read data or write data, but not typically both. Also, in a clock cycle, interconnect structure DQI may either hold read data or write data, but not typically both.

These constraints produce a resource conflict. This conflict is usually present in a pipelined device or system in which two bidirectional interconnects are separated by a pipeline register. FIG. 11a shows a timing diagram of a typical write operation of a typical memory device that does not have a write buffer. In FIG. 11a, it is assumed that register DB is not present and register DA is operated as a simple pipeline register; that is, it is unconditionally loaded on the rising edge of every clock cycle, like the other registers.

Clock cycles are labeled "A" through "L". A command sequence of four WRITEs, four READs, and four WRITEs is directed to memory device 850. These are denoted as "WR0, WR1, WR2, WR3, RD4, RD5, RD6, RD7, and WR8, respectively, on the RQ interface. For reasons described below, there is a two cycle gap (cycles E and F) between a WR3 command and a RD4 command, labeled as a "Bubble."

A WR0 command is provided on a RQ interface during cycle A. A WR0 command causes write data D0 that is present on a DQE interface in cycle C to be sampled by a register DA and be driven onto interconnect structure DQI during cycle D. Data D0 is written to the storage arrays during cycle D. A WR0 command that is sampled at an end of cycle A is held during cycles B, C, and D so that the appropriate drive enable signals and register load enable signals can be asserted at the correct time. Control logic for generating the appropriate enable signals is known by one of ordinary skill in the art and in not shown in order to clearly show the present embodiment of the present invention.

A WR0 command performs two distinct operations in an embodiment of the present invention, transport suboperation and retire suboperation, which together comprise a write operation. A transport suboperation includes moving write data on external interface DQE into register DA. A retire suboperation includes moving the write data from register DA into a storage array 1a(1). When no write buffer is present, WR commands causes both a transport and retire suboperation to occur at the proper time.

A RD2 command is provided on a RQ interface during cycle G. A RD2 command causes one of the storage arrays to be accessed in cycle H, and read data to be driven onto an internal interconnect structure DQI. This read data is sampled by register QA and driven onto interface DQE during cycle I. The RD2 command that is sampled at the end of cycle G is held during cycles H and I so that the appropriate drive enable signals and register load enable signals can be asserted at the correct time. Control logic for generating the appropriate enable signals is known by one of ordinary skill in the art and in not shown in order to clearly show the present embodiment of the present invention.

The timing used for a READ command produces read data at the earliest possible time as shown in FIG. 11a (one cycle for receiving the command, one cycle for the access, and one cycle for driving the data). Read data is provided on interface DQE two cycles after a READ command is provided on interface RQ.

The timing for a WRITE command has been artificially delayed so write data on interface DQE is also provided two cycles after a WRITE command is provided on interface RQ. Other alignments are possible, but this alignment has an advantage of simplifying an assignment of timing slots on interfaces RQ and DQE; when a command is placed in a timing slot on an interface RQ, there is a corresponding timing slot available on interface DQE.

However, read and write operations use two shared resources; interface DQE and interconnect structure DQI. Interconnect structure DQI is used at different times relative to a command on a interface RQ for the two operations (unlike interface DQE). Interconnect structure DQI is used three cycles after a WRITE command on an interface RQ, and one cycle after a READ command.

Because this shared resource is used at different relative times, a two-cycle bubble (cycles E and F) is introduced between WR3 and RD4 commands on a interface RQ. This bubble is shifted by two cycles to G and H on interface DQE, and two cycles L and M on interconnect structure DQI. If read and write operations used different timing sequences, the bubble would be shifted, but would still be present as a WR-WR-WR-WR-RD-RD-RD-RD-WR-WR command sequence is executed.

Some systems may require additional cycles on an external interface DQE when a controller changes between transmitting and receiving. This is not shown in FIG. 11a, but the bubble(s) created by this changing between transmitting and receiving constraint would be added to the two-cycle bubble described above.

A two-cycle bubble represents a performance loss to a system; a memory device is unable to execute any command in the two timing slots. However, it is possible to recover these two timing slots in an embodiment of the present invention.

FIG. 10 illustrates a variable depth write buffer including registers DA and DB according to an embodiment of the present invention. Registers DA and DB operate as a two entry write buffer, also known as a write queue or write buffer, in an embodiment of the present invention.

Timing of memory device 850 using registers DA and DB is shown in FIG. 11b. As described above, a write operation includes a transport suboperation and a retire suboperation. However, when using a variable depth write buffer, the timing of the operations are advantageously changed.

A WR0 command is provided on interface RQ during cycle A and causes write data D0 that is provided on interface DQE in cycle C to be sampled by register DA (transport suboperation). However, this WR0 command does not cause data D0 to be moved from register DA to a storage array. A write command WR2 that is provided on interface RQ in cycle C causes a retire suboperation to occur. If the WR2 command were not present in cycle C, write data D0 would remain in register DA and stay there until a WRITE command was provided on interface RQ.

A second register DB is provided for when a second WRITE command is presented immediately after the first (WR1 in cycle B). WR1 command causes write data D1 that is provided on interface DQE in cycle D to be sampled by register DB (transport suboperation). As with WR0 command, WR1 command does not cause data D1 to be moved from register DB to a storage array. Write command WR3 is provided on interface RQ in cycle D causes a retire suboperation to occur. Subsequent WRITE commands alternate the usage of registers DA and DB, using them as a two entry queue or First-In-First-Out ("FIFO") buffer. Two entries are needed because, as described above, there is a two-cycle difference between when the DQI interconnect structure is use by a read operation and a write operation in FIG. 11a.

The addition of three features (register DB, a transport suboperation and retire suboperation) allows for eliminating a two-cycle bubble at cycle E between commands WR3 and RD4. This is because after data D2 and D3 have been moved into registers DA and DB by a transport suboperation of a WR2 and WR3 commands, write data remains in the registers and will not need to use interconnect structure DQI in cycles F and G. This frees interconnect structure DQI immediately for a RD4 command.

A RD4 command is provided on interface RQ during cycle E. A RD4 command causes one of the storage arrays to be accessed in cycle F, and read data to be driven onto internal interconnect structure DQI. This read data is sampled by register QA and driven onto interface DQE during cycle G. A RD4 command that is sampled at the end of cycle E must be held during cycles F and G so that the appropriate interconnect drive enable signals and register load enable signals are asserted at the correct time. Control logic for generating the appropriate enable signals is known by one of ordinary skill in the art and in not shown in order to clearly show the present embodiment of the present invention.

After four READ commands have been sampled in cycles E through H, a fifth WRITE command WR8 is sampled in cycle I. WR8 command causes write data D8 that is provided on interface DQE in cycle K to be sampled by register DA (transport suboperation). A WR8 command also causes write data D2 in register DA to be moved into a storage array (retire suboperation) in cycle J.

Because write data may be stored in a register for an indefinite time, write address and mask information (and any other information associated with a write operation) is eventually provided to memory device 850. Write and mask information is included with either a WRITE command that performs a transport suboperation or with a WRITE command that performs a retire suboperation in embodiments of the present invention. When a WRITE command that performs a transport suboperation is used, write address and mask information is stored in a register along with write data. When a WRITE command that performs a retire suboperation is used, a memory controller stores write address and mask information, and supplies this information to memory device 850 with the appropriate WRITE command.

In an alternate embodiment of the present invention, a more deeply pipelined data path in used. For example, additional registers are used in a write buffer to ensure that all pending write operations which have had a transport suboperation completed may be held until a retire suboperation can be completed. Additional registers include not only those needed for write data, but also for all other information associated with a transport suboperation as described above.

A write operation that includes two suboperations is in a steady state; i.e. the write buffer is left in the same condition (full, for example). In alternate embodiments of the present invention, there are times during system operation that a write buffer is not full. For example, when memory device 850 is powered up, a transport suboperation may be completed, but there will be no valid data stored in a write buffer for a retire suboperation. In an embodiment of the present invention, a state bit is used to indicate whether a write buffer holds valid data. Thus, a retire suboperation can be suppressed when there is an indication of invalid data in a write buffer.

In alternate embodiments of the present invention, two additional commands, PRELOAD and UNLOAD, are used. A PRELOAD command causes only a transport suboperation and an UNLOAD command causes only a retire suboperation in an embodiment of the present invention. WRITE command is equivalent to a simultaneous PRELOAD and UNLOAD command in an embodiment of the present invention. A PRELOAD and UNLOAD command allows a write buffer to be precisely controlled. For example, in a DRAM core embodiment of the present invention, write data is only retired to a storage array that has the appropriate row accessed (this is also known as a page access, a page hit access or a open page access). If a read operation is targeted to a different row in the same storage array as a pending write operation in a write buffer, it may be advantageous to force the pending write operation to retire. If a memory controller has no other pending write operations pending, it may be best to use an UNLOAD command, which will retire write data and leave a write buffer entry empty. A PRELOAD command is then used instead of a WRITE command the next time that the write buffer entry was filled.

In an alternate embodiment of the present invention, an additional read register QA in used. This would allow timing slots occupied on interface DQE and internal interconnect structure DQI to be occupied for read and write operations by holding read data in registers QA and QB as described above in regard to registers DA and DB.

As can be appreciated by one of ordinary skill in the art, there are several advantages to bundling write control information with the retire suboperation instead of the transport suboperation. First, address information is not required to be buffered in a write buffer, reducing the size of a write buffer. Second, command-to-storage array access time is equal or approximately equal for READ and WRITE command, allowing higher utilization of the memory array data transfer interface (column I/O lines 266). Third, commands/addresses and data maintain consistent ordering between a control interface (control signal lines) and a memory array transfer interface (column I/O lines 266), potentially simplifying memory controller scheduling and coherency control logic. Fourth, explicit RETIRE commands are not required, therefore support for a retire suboperation may be omitted, saving request or control bandwidth and potentially reducing design complexity The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An integrated circuit memory device, comprising:
a memory core; and,
a variable depth write data buffer, coupled to the memory core, the variable depth write data buffer to store data to be stored in the memory core,
wherein a depth of the variable depth write data buffer is configured by a software-programmable register.

2. The integrated circuit memory device of claim 1, wherein the variable depth write data buffer is configured to store from 1 to 4 data packets of the data.

3. The integrated circuit memory device of claim 1, further comprising:
an interface, coupled to the variable depth write data buffer, capable of being coupled to an interconnect.

4. The integrated circuit memory device of claim 3, wherein a variable depth write data buffer size, in number of packets, is approximately equal to a first interval from the time a last symbol of a write data packet is present on the interconnect to the first possible time a first symbol of a read data packet is present on the interconnect divided by a second interval to transfer a read data packet on the interconnect.

5. The integrated circuit memory device of claim 4, wherein the write and read data packets includes 32 bits and the last and first symbols include bits of information.

6. The integrated circuit memory device of claim 1, wherein a depth of the variable depth write data buffer is varied as an inverse function of a width of the variable depth write data buffer.

7. The integrated circuit memory device of claim 1, wherein the variable depth write data buffer is a first-in-first-out buffer.

8. The integrated circuit memory device of claim 1, wherein the variable depth write data buffer is a randomly-addressable queue.

9. The integrated circuit memory device of claim 1, further comprising;
a write control buffer, coupled to the memory core, to store control information,
wherein a first data packet in the data is provided to the variable depth write data buffer during a first cycle of a clock signal and the first data packet is provided to the memory core during a second cycle of a clock signal in response to storing control information in the write control buffer during the second cycle of the clock signal.

10. The integrated circuit memory device of claim 9, wherein the control information includes a WRITE command.

11. The integrated circuit memory device of claim 9, wherein the control information is a WRITE command following a READ command.

12. The integrated circuit memory device of claim 9, wherein a second data packet is provided to the variable depth write data buffer during the second cycle of the clock signal.

13. A memory system, comprising:
an interconnect;
a memory controller, coupled to the interconnect, configured to generate a memory command including control information and write data; and,
an integrated circuit memory device, coupled to the interconnect, configured to process the memory command, wherein the integrated circuit memory device includes, a write control buffer to store the control information, and a variable depth write data buffer to store the write data, wherein the variable depth write data buffer is a randomly-addressable queue.

14. The memory system of claim 13, wherein the variable depth write data buffer is configured to store from 1 to 4 data packets of the write data.

15. The memory system of claim 13, wherein a variable depth write data buffer size, in number of packets, is approximately equal to a first interval from the time a last symbol of a write data packet is present on the interconnect to the earliest possible time a first symbol of a read data packet is present on the interconnect divided by a second interval to transfer from one of a read packet on the interconnect and a write packet on the interconnect.

16. The memory system of claim 15, wherein the write and read data packets include 32 bits and the last and first symbols include bits of information.

17. The memory system of claim 13, wherein a depth of the variable depth write data buffer is varied as an inverse function of a width of the variable depth write data buffer.

18. The memory system of claim 13, wherein the variable depth write data buffer depth is configured by a software-programmable register.

19. The memory system of claim 13, wherein the variable depth write data buffer depth is configured by a fuse.

20. The memory system of claim 13, wherein the variable depth write data buffer depth is configured by a anti-fuse.

21. The memory system of claim 13, wherein the variable depth write data buffer depth is configured by a pin.

22. The memory system of claim 13, wherein the variable depth write data buffer depth is configured by a metal mask.

23. The memory system of claim 13, wherein a first data packet in the write data is provided to the variable depth write data buffer during a first cycle of a clock signal and the first data packet is provided to the memory core during a second cycle of the clock signal in response to storing the control information in the write control buffer during the second cycle of the clock signal.

24. The memory system of claim 13, wherein the memory command is a memory WRITE command that follows a READ command.

25. The memory system of claim 23, wherein a second data packet is provided to the variable depth write data buffer during the second cycle of the clock signal.

26. A method of operating a memory system with a controller device coupled to an integrated circuit memory device, the method comprising:

generating a first command by the controller device, during a first cycle of a clock signal, the first command including first write data;

buffering the first write data in a variable depth write data buffer, the variable depth write data buffer disposed in the integrated circuit memory device; and, providing the first write data to a memory core of the integrated circuit memory device, during a second cycle of a clock signal, in response to a second command generated by the controller devices, wherein the memory core includes a dynamic random access memory ("DRAM") core.

27. The method of claim 26, wherein the first command is a first PRELOAD command and the second command is a WRITE command.

28. The method of claim 27, further comprising:

generating a second PRELOAD command, during the second cycle of the clock signal, the second PRELOAD command including second write data; and, buffering the second write data.

29. The method of claim 26, wherein the variable depth write data buffer is a first-in-first-out buffer.

30. The method of claim 26, wherein the variable depth write data buffer is a randomly-addressable queue.

31. The method of claim 26, wherein the providing is performed after a read operation of the memory core.

32. The method of claim 26, wherein no address information associated with the first write data is generated during the first cycle of the clock signal.

* * * * *